(12) United States Patent
Stahr et al.

(10) Patent No.: US 11,749,573 B2
(45) Date of Patent: Sep. 5, 2023

(54) COMPONENT CARRIER WITH A STEPPED CAVITY AND A STEPPED COMPONENT ASSEMBLY EMBEDDED WITHIN THE STEPPED CAVITY

(71) Applicant: AT & S Austria Technologie & Systemtechnik Aktiengesellschaft, Leoben (AT)

(72) Inventors: Johannes Stahr, St. Lorenzen (AT); Gerald Weidinger, Leoben (AT); Gerhard Schmid, Trofaiach (AT); Andreas Zluc, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 98 days.

(21) Appl. No.: 17/303,264

(22) Filed: May 25, 2021

(65) Prior Publication Data

US 2021/0280479 A1 Sep. 9, 2021

Related U.S. Application Data

(63) Continuation of application No. 16/436,111, filed on Jun. 10, 2019, now Pat. No. 11,049,778.

(30) Foreign Application Priority Data

Jun. 11, 2018 (EP) ........................... 8177090

(51) Int. Cl.
*H01L 23/13* (2006.01)
*H01L 23/498* (2006.01)
(Continued)

(52) U.S. Cl.
CPC ........ *H01L 23/13* (2013.01); *H01L 23/49838* (2013.01); *H01L 24/83* (2013.01);
(Continued)

(58) Field of Classification Search
CPC ... H01L 23/13; H01L 23/49838; H01L 24/83; H01L 2224/83005; H01K 3/4687
(Continued)

(56) References Cited

U.S. PATENT DOCUMENTS 3,606,057 A1  12/2013  Rudman et al.
8,737,085 B2  5/2014  Sasaoka
(Continued)

FOREIGN PATENT DOCUMENTS

CN  107295747 A  10/2017
CN  206819971 U  12/2017
(Continued)

OTHER PUBLICATIONS

Schweiger, D.; Communication Pursuant to Article 94(3) EPC in Application No. 18 177 090.0; pp. 1-6; dated Aug. 12, 2021; European Patent Office; Postbus 5818, 2280 HV Rijswijk, Netherlands.
(Continued)

*Primary Examiner* — Thinh T Nguyen
(74) *Attorney, Agent, or Firm* — Robert A. Blaha; Smith Tempel Blaha LLC (57) ABSTRACT

Described are component carriers including a stepped cavity into which a stepped component assembly is embedded. The component carriers have (a) fully cured electrically insulating material originating from at least one electrically insulating layer structure of the component carrier and circumferentially surrounding the stepped component assembly and/or (b) an undercut in a transition region between a narrow recess and a wide recess of the stepped cavity. Further described are methods for manufacturing such component carriers.

9 Claims, 5 Drawing Sheets

(51) Int. Cl.
    *H05K 1/18*     (2006.01)
    *H01L 23/00*     (2006.01)

(52) U.S. Cl.
    CPC .... *H01L 2224/83005* (2013.01); *H05K 1/185* (2013.01); *H05K 1/186* (2013.01)

(58) Field of Classification Search
    USPC .......................... 257/773, 783; 438/618, 686
    See application file for complete search history.

(56) References Cited

U.S. PATENT DOCUMENTS

| | | |
|---|---|---|
| 2006/0065433 A1 | 3/2006 | Danoski et al. |
| 2008/0029895 A1 | 2/2008 | Hu et al. |
| 2008/0158821 A1* | 7/2008 | Sandwall ............. H05K 1/0204 361/704 |
| 2010/0301473 A1 | 12/2010 | Sasaoka |
| 2012/0217049 A1 | 8/2012 | Hanai et al. |
| 2015/0334843 A1 | 11/2015 | Jung et al. |
| 2016/0050771 A1 | 2/2016 | Yu et al. |
| 2016/0150651 A1 | 5/2016 | Tsai et al. |
| 2018/0092220 A1 | 3/2018 | Wiedenhofer |

FOREIGN PATENT DOCUMENTS

| | | |
|---|---|---|
| CN | 207022286 U | 2/2018 |
| EP | 2 031 946 A1 | 3/2009 |
| EP | 2 227 076 A1 | 9/2010 |
| WO | 2013/029073 A1 | 3/2013 |
| WO | 2015/127486 A1 | 9/2015 |
| WO | 2015/149097 A1 | 10/2015 |
| WO | 2015/150474 A1 | 10/2015 |
| WO | 2017168323 A1 | 10/2017 |

OTHER PUBLICATIONS

Notice of Grant in Application No. 201910498454.9; pp. 1-4; dated Nov. 22, 2022; The China National Intellectual Property Administration; No. 6, Xitucheng Lu, Jimenqiao Haidian District, Beijing City, 100088, China.

English Translation of Notice of Grant in Application No. 201910498454.9; pp. 1-2; dated Nov. 22, 2022; The China National Intellectual Property Administration; No. 6, Xitucheng Lu, Jimenqiao Haidian District, Beijing City, 100088, China.

* cited by examiner

COMPONENT CARRIER WITH A STEPPED CAVITY AND A STEPPED COMPONENT ASSEMBLY EMBEDDED WITHIN THE STEPPED CAVITY

CROSS-REFERENCE TO RELATED APPLICATIONS

This application is a continuation of co-pending U.S. Non-provisional patent application Ser. No. 16/436,111 filed on Jun. 10, 2019 and claims the benefit of and right of priority to European Patent Application No. 18 177 090.0 filed 11 Jun. 2018, the disclosures of which are hereby incorporated herein by reference.

TECHNICAL FIELD

Embodiments of the present invention generally relate to the technical field of component carriers onto which in usual applications electronic components are mounted in order to form an electronic assembly. In particular, embodiments of the present invention relate to a component carrier comprising a stepped cavity into which a stepped component assembly is embedded and to methods for manufacturing such component carriers.

TECHNOLOGICAL BACKGROUND

Component carriers onto which electronic assemblies comprising several electronic components are built up are widely used in many electronic consumer devices such as for instance computing devices, communication devices, display devices etc. This enumeration is not complete and the number and the type of electronic devices having electronic assemblies built up at component carriers is continuously getting larger.

In order to increase the integration density of electronic assemblies there have been developed component carriers which, in addition of providing mechanical support and electric connections for surface mount device (SMD) electronic components, provide some further functionality by embedding components such as e.g. active or passive electronic components, thermal conductive components, optical components etc. Further functionality can be added to a component carrier also by embedding a sensor device such as an optical sensor, a temperature sensor, a gas sensor etc.

US 2012/0217049 A1 discloses a printed circuit board (PCB) having a cavity into which an imaging device is embedded. The imaging device comprises a light receiver. The imaging device is embedded in such a manner that that the light receiver faces a first surface of a substrate of the PCB.

Embedding an imaging device or generally embedding a sensor device into a component carrier such as a PCB is a procedure which has to be carried out very carefully. In particular when embedding a sensor device close to a surface of a component carrier it has to be made sure that a typically very sensitive sensing surface of the sensor device will not be damaged e.g. when during manufacture of the component carrier the sensor device is subjected to a possibly harmful chemical or mechanical environment and/or is subjected to high temperatures.

In this context it is known to temporarily protect a sensor device to be embedded with an appropriate sensor protection film. However, using such protection film makes the manufacture of a component carrier having an embedded component such as a sensor complex and costly.

SUMMARY

There may be a need for facilitating the manufacture of a component carrier having an embedded component.

This need may be met by the subject matter according to the independent claims. Advantageous embodiments of the present invention are described by the dependent claims.

According to a first aspect of the invention there is described a method of manufacturing a component carrier. The described method comprises (a) providing a temporary carrier; (b) providing, attached to the temporary carrier, an at least partially uncured electrically insulating layer structure having a narrow recess; (c) providing a layer stack comprising at least one electrically insulating layer structure and/or at least one electrically conductive layer structure, the layer stack having a wide recess; (d) arranging a stepped component assembly at least within the narrow recess; and (e) (mechanically)connecting the at least partially uncured electrically insulating layer structure with the layer stack by curing the (previously) at least partially uncured electrically insulating layer structure such that the stepped component assembly is arranged within a stepped cavity being defined by the narrow recess and by the wide recess.

According to a further aspect of the invention there is described a component carrier comprising (a) a layer stack comprising at least two electrically insulating layer structures and/or at least one electrically conductive layer structure and comprising a stepped cavity within the layer stack, the stepped cavity having a wide recess and a narrow recess; and (b) a stepped component assembly arranged within the stepped cavity. The stepped component assembly is substantially completely circumferentially surrounded by a fully cured electrically insulating material originating from at least one electrically insulating layer structure of the at least two electrically insulating layer structures.

In another embodiment, a method of manufacturing a component carrier includes providing a layer stack comprising at least one electrically insulating layer structure and/or at least one electrically conductive layer structure; forming a stepped cavity within the layer stack, the stepped cavity being defined by a narrow recess and by a wide recess, wherein the wide recess is formed by inserting a non-adhesive material in the layer stack and removing a portion of the layer stack above the non-adhesive material; and embedding a stepped component assembly within the stepped cavity.

In an alternative embodiment a component carrier includes a layer stack having at least one electrically insulating layer structure and/or at least one electrically conductive layer structure; a stepped cavity within the layer stack, the stepped cavity including a narrow recess and a wide recess; and a stepped component assembly embedded within the stepped cavity, with the stepped cavity including an undercut in a transition region between the narrow recess and the wide recess.

OVERVIEW OF EMBODIMENTS

In the context of this document, the term "component carrier" may denote any support structure which is capable of accommodating one or more (electronic) components thereon and/or therein for providing mechanical support and/or electrical connectivity. In other words, a component carrier may be configured as a mechanical and/or electric carrier for components. Electrical conductivity is provided by conductor paths which may be formed at the surface of the component and/or within inner structured electrically conductive layers of the component carrier being realized as a so-called multilayer component carrier.

In particular, a component carrier may be one of a Printed Circuit Board (PCB), an (organic) interposer, and an IC Integrated Circuit (IC) substrate. A component carrier may also be a hybrid board combining different ones of the above-mentioned types of component carriers.

In an embodiment, the component carrier comprises a stack of at least one electrically insulating layer (structure) and at least one electrically conductive layer (structure). For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier being capable of providing a large mounting surface for further components and being nevertheless very thin and compact. The term "layer structure" may in particular denote a continuous layer, a patterned layer or a plurality of non-consecutive islands within a common plane.

In an embodiment, the component carrier is shaped as a plate. This contributes to a compact design, wherein the component carrier nevertheless provides a large basis for mounting (surface mount device, SMD) components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In this document the term "Printed Circuit Board" (PCB) may particularly denote a component carrier which is formed by laminating several electrically conductive layer structures with at least one electrically insulating layer structure, for instance by applying pressure, if desired accompanied by the supply of thermal energy. A PCB may be plate-shaped (i.e. planar), three-dimensionally curved (for instance when manufactured using 3D printing), or may have any other shape. As preferred materials for PCB technology, the electrically conductive layer structures are made of copper, whereas the electrically insulating layer structures may comprise resin and/or glass fibers, so-called prepreg material or, after curing, FR4 material. The various electrically conductive layer structures may be connected to one another in a desired way by forming through-holes through the laminate, for instance by laser drilling or mechanical drilling, and by filling them with electrically conductive material such as in particular copper, thereby forming vias as through-hole connections. Alternatively, at least some via connections may be realized by means of blind vias. Apart from one or more (electronic) components which may be embedded, a PCB is usually configured for accommodating one or more SMD components on one or both opposing surfaces of the plate-shaped PCB. They may be connected to the respective main surface by soldering. A dielectric part of a PCB may be composed of resin with reinforcing fibers such as e.g. glass fibers.

In this document the term "substrate" may particularly denote a small component carrier having substantially the same size as a component (in particular an electronic component) to be mounted thereon. More specifically, a substrate can be understood as a carrier for electric connections or electric networks as well as component carrier comparable to a Printed Circuit Board (PCB), however with a considerably higher density of laterally and/or vertically arranged connections. Lateral connections are, for example, conductive paths, whereas vertical connections may be for example drill holes. These lateral and/or vertical connections are arranged within the substrate and can be used to provide electrical and/or mechanical connections of housed components or unhoused components such as bare dies or semiconductor IC chips, with a PCB or intermediate PCB. The (electronic) components, in particular unhoused or bare components, may be components being embedded within the component carrier. Thus, the term "substrate" may also include "IC substrates". A dielectric part of a substrate may be composed of resin with reinforcing spheres (such as glass spheres).

The described at least one electrically insulating layer structure may comprise at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon®), a ceramic, and a metal oxide. Reinforcing materials such as webs, fibers or spheres, for example made of glass (multilayer glass) may be used as well. Teflon® is a registered trademark of The Chemours Company FC of Delaware, U.S.A. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

The at least one electrically conductive layer structure may comprise at least one of the group consisting of copper, aluminum, nickel, silver, gold, palladium, and tungsten. Although copper is usually preferred, other materials or coated versions thereof are possible as well, in particular coated with supra-conductive material such as graphene.

A component (of the stepped component assembly) can be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

The component carrier may be a laminate-type component carrier. In such an embodiment, the component carrier is a compound of multiple layer structures which are stacked and connected together by applying a pressing force, if desired accompanied by heat.

In this document the term "at least partially uncured material" particularly denotes a material which has the property to at least partially melt or become flowable by the application of elevated pressure and/or elevated temperature, and become fully hardened or cured (and thereby becomes solid) when releasing the applied elevated pressure and/or elevated temperature. Consequently, applying elevated pressure and/or elevated temperature may cause melting of the curable or at least partially uncured material, followed by an irreversible hardening upon releasing the applied high pressure and/or high temperature. In particular, the "at least partially uncured material" may comprise or consist of a so-called B-stage material and/or a so-called A-stage material. By providing a layer (structure) with resin, prepreg, or any other B-stage material the layer (structure) may re-melt during lamination so that resin (or the like) may flow for interconnecting the various elements and for closing gaps or voids and may therefore contribute to a stable intrinsic interconnection within the component carrier under manufacture. Upon connecting such a structure by the application of pressure and/or heat, i.e. by lamination, only the low-flow prepreg or no-flow prepreg will re-melt slightly and accomplish a local connection. Two fully cured layer structures will not establish a mutual adhesive connection, allowing to subsequently take out a piece delimited by a circumferential milling line and a connection area between the two fully cured layer structures.

The described method of manufacturing a component carrier is based on the idea that a temporary carrier being temporarily arranged at the surface of a component carrier into which a stepped component assembly is to be embedded can be used in beneficial manner for two purposes (A) and (B).

A first purpose (A) is to serve as a mechanical stop when inserting the stepped component assembly into the stepped cavity. Thereby, it can be made sure that, when inserting the stepped component assembly "as deep as possible" into the stepped cavity, a front surface of the component will be perfectly aligned with the outer surface of the component carrier at which the temporary carrier is arranged. This means that the front surface of the component and the outer surface of the component carrier are coplanar. Such a coplanarity may be suitable for many applications of embedded (electronic and/or optic) components because (i) on the one hand the component is exposed to the outside of the component carrier and (ii) on the other hand the component is not protruding from the outer surface of the component carrier.

A second purpose (B) is to serve as a (mechanical) protection during the procedure of embedding and, if applicable, during a further processing of the component carrier with the already embedded component.

This may simplify processing because comparatively "rough" process steps can be employed which, in the absence of the protecting temporary carrier, may harm at least the front surface of the component of the stepped component assembly.

In some embodiments the described temporary carrier may be realized simply as an adhesive tape. The adhesive tape may be for instance a so called "thermo release tape" the stickiness of which can be reduced simply by applying heat.

The step of connecting the at least partially uncured electrically insulating layer structure may be realized by means of a proper lamination procedure by applying pressure to the entire layer structures (including the temporary carrier). Such a lamination can be supported in a known manner by thermal energy, which may cause a "melting" of the partially uncured electrically insulating layer. During the lamination process the "molten" material, in particular resin, may flow around at least one component of the stepped component assembly such that the component assembly will be embedded within the component carrier in a (mechanically) smooth and reliable manner.

For the sake of clarity it is pointed out that the steps being defined with the described method may be carried out in different sequences:

(A) In some embodiments (see e.g. FIGS. 1A to 1E) a part of the stepped component assembly, namely a narrow component of the stepped component assembly, is inserted into the narrow recess before the provided layer stack (having the wide recess) is placed next to the at least partially uncured electrically insulating layer structure (having the narrow recess). With this placement of the layer stack, which placement is done before the final "connecting step", the wide recess is imposed on the wide component of the stepped component assembly. This means that the stepped cavity is formed after only a part of the stepped component assembly is arranged within the narrow recess of the later formed stepped cavity.

(B) In other embodiments (see e.g. FIGS. 2A to 2L) the stepped cavity is formed before the stepped component assembly is inserted therein. This means that the layer stack having the wide recess is placed at or adjacent to the at least partially uncured electrically insulating layer structure having a narrow recess before the stepped component assembly is inserted into the stepped cavity. Also, in these other embodiments the step of connecting the at least partially uncured electrically insulating layer structure with the layer stack by curing the at least partially uncured electrically insulating layer structure is the last step of the described method. Of course, further processing steps may follow.

According to a further embodiment of the invention at least one electrically insulating layer structure of the layer stack comprises a further at least partially uncured electrically insulating layer structure. This may provide the advantage that not only a first (upper) component of the stepped component assembly but also the second (lower) component of the stepped component assembly may be embedded in a reliable manner. Thereby, benefit may be taken from the presence of the additional at least partially uncured electrically insulating material of the further at least partially uncured electrically insulating layer structure.

According to a further embodiment of the invention the method further comprises, after arranging the stepped component assembly within the stepped cavity and before connecting the at least partially uncured electrically insulating layer structure with the layer stack, laminating the entire structure comprising (at least) the temporary carrier, the at least partially uncured electrically insulating layer structure, and the layer stack in such a manner that at least partially uncured electrically insulating material flows at least partially around the stepped component assembly. This may provide the advantage that already during the lamination procedure the stepped component assembly can be embedded within the stepped cavity in a mechanically smooth and reliable manner.

In (above described) embodiments, where the layer stack also comprises the (at least one) further at least partially uncured electrically insulating layer structure the corresponding further at least partially uncured material may flow around the stepped component assembly. This means that the overall flow of at least partially uncured electrically insulating material may "start from different location" such that the stepped component assembly can be embedded in a reliable manner from both (upper) and (lower) sides.

According to a further embodiment of the invention the method further comprises removing the temporary carrier from the connected structure comprising the previously at least partially uncured electrically insulating layer structure and the layer stack. This may provide the advantage that at the surface, where the temporary carrier has been arranged, further processing of the connected structure can be accomplished. Such a further processing may not only include appropriate surface treatment but also a building up a further layer structure in order to add an appropriate built-up structure which may add further functionality to the manufactured component carrier.

According to a further embodiment of the invention the method further comprises providing a single electrically conductive layer structure between (i) the temporary carrier and (ii) the at least partially uncured electrically insulating layer structure having the narrow recess. Thereby, in particular the single electrically conductive layer structure has an opening being spatially concurrent with the narrow recess.

This embodiment may provide the advantage that after removing the temporary carrier there will be an outer conductive layer structure which can be used for electrically contacting the component carrier respectively the embedded stepped component assembly with electronic circuitry being external to the component carrier. Thereby, appropriate conductor paths can be formed from the single electrically conductive layer structure by means of an appropriate structuring or patterning. Further, preferably after removing the temporary carrier electric connections to the "inside" of the component carrier and in particular to the embedded stepped component assembly can be formed by metallizing vias, which may be generated by means of known mechanical and/or laser drilling procedures.

The described component carrier is based on the idea that a smooth and reliable embedding of the stepped component assembly can be realized by using previously at least partially uncured electrically insulating material from an electrically insulating layer structure within which one of the two recesses of the stepped cavity is formed. This means that at least one of the two electrically insulating layer structures serves not only as a structure defining one of the recesses of the stepped cavity but also as a reservoir for at least partially uncured electrically insulating material which, e.g. during a proper lamination procedure, is used for embedding at least a part of the stepped component assembly. Thereby, gaps, which may be formed between an outer surface of the stepped component assembly and an inner sidewall of the respective (narrow or wide) recess, may be filled with this at least partially uncured material, which will later be cured e.g. by releasing pressure and/or by lowering the temperature.

Filling such gaps can be realized by allowing the at least partially uncured electrically insulating material to flow around the stepped component assembly.

The wide recess can be seen as a wide shallow portion of the stepped cavity and the narrow recess can be seen as a deep narrow portion. In this consideration a part of the deep narrow portion it is located within the wide shallow portion of the stepped cavity.

In the context of this document the term "substantially completely circumferentially surrounded" may denote that along the circumferential direction around the stepped component assembly there is a gap between the stepped component assembly and an inner sidewall of the stepped cavity, which is filled by fully cured electrically insulating material. Thereby, the gap may extend fully around the stepped component assembly and may be filled completely or partially (=substantially completely) with the fully cured electrically insulating material. In other embodiments, a gap, which may at least partially be filled with the fully cured electrically insulating material may not extend completely around the stepped component assembly.

The term "circumferentially" may refer to a plane which is parallel with respect to the main planes of the component carrier respectively the layer stack. This means that the surfaces of the stepped component assembly, which are in direct contact with the fully cured electrically insulating material, are side or lateral surfaces of the stepped component assembly. Thereby, a side surface has a normal vector which is parallel to the main planes and perpendicular to a z-axis being oriented parallel to a normal vector of the main planes.

However, in this respect it is mentioned that the fully cured electrically insulating material may not only be present lateral from or next to the side surfaces of the stepped component assembly. The stepped component assembly may also be embedded (along the vertical z-direction) at its upper side and/or at its lower side by fully cured electrically insulating material.

It is pointed out that the term "circumferentially surrounded" is not to be understood as to refer only to a stepped component assembly which, along the z-direction, has a circular cross section. Instead, "circumferentially surrounded" may be understood in such a manner that the fully cured electrically insulating material may be present or encompass the stepped component assembly substantially completely along the (lateral) outline or length around the (upper and/or smaller) component of the stepped component assembly.

According to an embodiment of the invention the stepped component assembly is substantially completely circumferentially surrounded by a further fully cured electrically insulating material originating from at least one other electrically insulating layer structure of the at least two electrically insulating layer structures. This may mean that when manufacturing the component carrier, in particular by employing a lamination procedure, not only one of the electrically insulating layer structures but both of them must originally be in an at least partially uncured state.

In some embodiments, the fully cured electrically insulating material may be in contact predominantly or completely with one of the components of the stepped component assembly and the further fully cured electrically insulating material may be in contact predominantly or completely with the other one of the components of the stepped component assembly. Thereby, the spatial distribution between the fully cured electrically insulating material and the further fully cured electrically insulating material may be such that one of the two materials is exclusively and only in contact with only one of the two components of the stepped component assembly.

Embedding the stepped component assembly with fully cured material originating from different electrically insulating layer structures may provide the advantage that at least with respect to the (vertical) z-direction the stepped component assembly may be embedded in a symmetric manner which may further increase the reliability of an electronic circuit comprising the stepped component assembly with respect to (thermal) stress.

According to a further aspect of the invention there is described a method of manufacturing a component carrier. The described method comprises (a) providing a layer stack comprising at least one electrically insulating layer structure and/or at least one electrically conductive layer structure; (b) forming a stepped cavity within the layer stack, the stepped cavity being defined by a narrow recess and by a wide recess, wherein the wide recess is formed by inserting a non-adhesive material in the layer stack and removing a portion of the layer stack above the non-adhesive material; and (c) embedding a stepped component assembly within the stepped cavity.

The described method is based on the idea that a stepped cavity can be formed by taking out a material piece from at least one layer of the component carrier which material piece corresponds to one of the two recesses. Thereby, an adhesion between two (electrically insulating) layer structures is intentionally reduced by the non-adhesive material which is placed within a region which spatially corresponds to the bottom surface of the material piece. The non-adhesive material can be inserted into the proper position or location by way of a so-called release layer being located on top of a layer structure which is supposed to be located directly below the respective recess (portion).

Before being able to take out the corresponding material piece it should be ensured that the along a lateral direction the material piece is separated from the material of the corresponding at least one layer of the component carrier. This can be done by cutting trenches within the respective component carrier layer, which trenches (fully) encompass the material piece being supposed to be taken out. Cutting trenches can be done by mechanical and/or laser cutting or milling.

Also, in this aspect the wide recess can be seen as a wide shallow portion of the stepped cavity and the narrow recess can be seen as a deep narrow portion of the stepped cavity. In this consideration a part of the deep narrow portion it is located within the wide shallow portion of the stepped cavity.

It is pointed out that with this "release layer (RL) technique" not only one of the two recesses but both recesses of the stepped cavity can be formed. Thereby, in view of the stepped design of the cavity the area of the corresponding two release layers is different.

According to an embodiment of the invention the method further comprises electrically connecting the stepped component assembly with conductive structures formed within the layer stack by means at least one of thermal compression bonding, soldering, and applying a conductive glue. This may provide the advantage that the electric contact to and/or from at least one component of the stepped component assembly can be realized simultaneously with a proper lamination step.

Preferably, before the performing the described electrically connecting appropriate vertical via structures and/or horizontal conductor paths may have already been formed within the respective at least one electrically insulating structure and/or the at least one electrically conductive layer structure. Thereby, also a rather complex electric wiring or circuitry can be used for electrically connecting the stepped component assembly within the described component carrier. In this context it is pointed out that after or together with a lamination process with which inter alia the electric connection to and/or from the stepped component assembly is realized, there may be further electrically insulating layer structures and/or further electrically conductive layer structures being attached to the layer stack.

This means that in a final product the described component carrier may comprise one or more further built-up structures.

According to a further embodiment of the invention the method further comprises filling a gap between at least one component of the stepped component assembly and an inner sidewall of the stepped cavity. The gap may be in particular a gap being formed between a larger component of the stepped component assembly and an inner sidewall of the wide recess.

Inserting a filling or underfilling material within gaps being present between the stepped component assembly and sidewalls of the stepped cavity may provide the advantage that the stepped component assembly can be embedded in a smooth and mechanically reliable manner. Thereby, the number and/or the size of the gaps to be filled with (under) filling material can be chosen depending on the specific application of or for the described component carrier.

It is pointed out that in particular an underfilling material may not only be inserted within the side gap but also within a gap between a horizontal surface portion of the stepped component assembly and a correspondingly horizontal side wall of the stepped cavity. This may provide the advantage that at least one component of the stepped component assembly cannot only be embedded along the lateral direction but also along at least one vertical direction. This may further improve the embedding quality.

According to a further aspect of the invention there is described a component carrier comprising (a) a layer stack comprising at least one electrically insulating layer structure and/or at least one electrically conductive layer structure; (b) a stepped cavity within the layer stack, the stepped cavity comprising a narrow recess and a wide recess; and (c) a stepped component assembly embedded within the stepped cavity. The stepped cavity comprises an undercut in a transition region between the narrow recess and the wide recess.

The described component carrier is based on the idea that when a stepped cavity is formed within the component carrier by taking out a material piece from at least one layer of the component carrier, which material piece corresponds to one of two recesses, it is of advantage to make the (horizontal) area of a non-adhesive material layer at least slightly larger than the horizontal area of the material piece to be taken out. Otherwise, there is a risk that a cut trench extending from the top down to the level of the non-adhesive material layer will not reach the non-adhesive material. Such a horizontal offset would have the effect that within a typically small horizontal region the cut out material piece would stick to the lower layer which may make taking out that material piece impossible or at least very difficult.

When, after having taking out the respective material piece the non-adhesive material is removed from the region of the cavity, the non-adhesive material being located laterally outside from the respective (narrow or wide) recess will also be removed at least partially although the material is covered by an upper layer structure (from which the material piece has been taken out). The removal of the (comparatively small portion of) non-adhesive material results in a deformation of the described undercut in the transition region between the narrow recess and the wide recess.

According to an embodiment of the invention the narrow recess is a through opening extending through the entire layer stack. Further, the component carrier further comprises an adhesive film being formed at a lower surface of the layer stack and closing the through opening.

The adhesive film formed at the bottom surface of the layer stack may provide the advantage that it allows for a subsequent insertion of a filling or underfilling material even when the narrow recess is realized as a through opening. In this context it is mentioned that, as compared to the formation of a blind opening, a through opening significantly facilitates the formation of the narrow recess and, as a consequence, also of the entire stepped cavity.

It is pointed out that the component carrier described with this embodiment will typically represent an intermediate product for further processing the component carrier. Apart from inserting filling or underfilling material in gaps between the stepped cavity and the stepped component assembly the adhesive film may be used for performing an asymmetric lamination wherein, apart from the described layer stack and with respect to the surface at which the adhesive film is formed, a further built-up structure can be formed at an opposing surface of the layer stack. Thereby, the adhesive film may be seen as to represent a temporary carrier for the layer stack.

According to a further embodiment of the invention the stepped component assembly comprises a stack of at least two components having a different size and/or a different functionality. Thereby, a first (upper) component may be smaller and/or may have a smaller lateral extension then a second (lower) component of the stepped component assembly.

The two components may be electronic components which are electrically connected with each other. Thereby, the two components may be arranged face to face being directly connected with each other by means of any suitable contact structure, for instance solder balls.

The two components may also be connected indirectly with each other for instance by means of an intermediate electronic component or intermediate electronic structure. Thereby, the intermediate electronic structure may be seen as one component of the stepped component assembly, in particular when the size respectively the lateral extension of the intermediate electronic structure is different from the first electronic component and/or the second electronic component. In this case the stepped electronic assembly comprises three components. In case all of the three components have different sizes respectively lateral extensions the stepped component assembly has an outer shape with two steps. In this respect it is mentioned that there is no principal maximum number for the number of components being comprised by the stepped component assembly.

The intermediate electric structure may be an IC substrate or an interposer. The substrate or interposer may consist of at least a layer of glass, Silicon (Si) or a photoimageable or dry-etchable organic material like epoxy-based Build-Up films or polymer compounds like Polyimide, Polybenzoxazole, or Benzocyclobutene.

In some applications the intermediate electric structure may be a PCB like structure having a high spatial density of vertical electric connections wherein neighboring electric connections have an average distance or at least a distance in some sections of the intermediate electric structure of less than 150 μm and preferably less than 75 μm. The same spatial distances or even smaller distances are given for an interposer or a substrate having the two electronic components mounted thereto at opposing surfaces of the interposer or substrate. In preferred embodiments the high integration density of electric connections is realized with an interposer or a substrate being free from typical materials for electrically insulating layer structures of PCBs comprising glass fibres like FR4 material. Thus, an even higher density of connections is possible wherein the neighboring vertical electric connections may have a distance in some sections of the intermediate electric structure of less than 30 μm and preferably less than 15 μm. Ultra-high-density electric connections between the at least two components having a distance of the neighboring vertical electric connections in some sections of the intermediate electric structure below 5 μm may be realized by means of so called "Through-Silicon Vias".

In most preferred embodiments the two components are horizontally aligned with respect to a vertically oriented symmetry axis. With respect to this symmetry axis and/or with respect to a symmetry plane comprising the symmetry axis the stepped component assembly is symmetric. The same holds mutatis mutandis also for the spatial design of the stepped cavity.

According to a further embodiment of the invention the component carrier further comprises at least one contact element extending from the larger component to a surface of the component carrier and penetrating a layer structure of the layer stack within which the narrow recess is formed.

This may mean that at least one contact element is located horizontally next to the smaller component of the stepped component assembly. In case an upper surface of the smaller component is coplanar with an upper surface of the component carrier the contact element reaches the surface of the component carrier at the same side as the upper surface of the smaller component. This may be in particular of advantage for a sensor application because the sensing component carrier can be contacted from the outside at its "sensitive side".

The mentioned contact element may be realized by means of or may comprise for instance a metallized via or a stack of metallized vias.

According to a further embodiment of the invention the component carrier comprises at least one of the following features: (a) at least one of the two components is a sensor component; (b) an upper surface of component assembly is coplanar with an upper surface of the layer stack; (c) one (upper) component is or comprises a protection element; and (d) one (upper) component is or comprises an optical lens.

With regard to the embodiment (a) where at least one of the two components is a sensor component:

Depending on the intended functionality of application the sensor component may be an optoelectronic sensor, a gas sensor, a temperature sensor, a magnetic field sensor, an electric field sensor etc. Preferably, the sensor is realized by this (electronic) component of the stepped component assembly, which component is the smaller one. The other larger electronic component may be used for processing and/or for evaluating measurement signals provided by the sensing sensor component and/or for providing electric power to the sensor component.

Depending on the specific application a sensing surface of the sensor component may be located outside from the component carrier or may be located recessed within the component carrier or the layer stack. Arranging the sensing surface outside from the layer stack may provide the advantage that the environment of the component carrier can be sensed easily. Arranging the sensing surface within a recess (being a part of the stepped cavity) may provide the advantage that the sensor component is protected from unwanted (mechanical) impacts acting on the component carrier. Such a protection can be increased by means of a suitable protection material, e.g. a transparent mold, being formed within the recess and/or over the sensing surface.

With regard to the embodiment (b) where an upper surface of component assembly is coplanar with an upper surface of the layer stack:

The upper surface may form a flat plane together with the corresponding surface of the component carrier or the layer stack. Embodiments where these two surfaces form a common flat surface of the component carrier may allow to design an electronic device with the component carrier representing at least a portion of a housing of this electronic device (comprising the component carrier) in such a manner that the stepped component assembly is integrated within the component carrier without being visible from outside.

The described coplanar design may be in particular of advantage in case the (upper) component of the stepped component assembly is a sensor component. In such cases the upper component of the stepped component assembly has a surface which is arranged within the same plane as the upper surface of the layer stack. Further advantage may be taken from such embodiments when the sensor component comprises a sensing surface being located within the plane of the corresponding outer surface of the component carrier.

With regard to the embodiment (c) where one (upper) component is or comprises a protection element:

This may provide the advantage that (the upper surface of) the stepped component assembly can be protected from external impacts. This may be in particular of advantage in case the protected surface of the stepped component assembly it is a sensing surface of a sensor component.

With regard to the embodiment (d) where one (upper) component is or comprises an optical lens:

Providing an optical element such as a lens may be of advantage in case the sensor component is an optically sensor. In this case light can be focused on the sensing surface of the optical sensor component. It is mentioned that such an optically component may also make sense in case the (upper) component of the stepped component assembly is a light source such as a light emitting diode or a laser diode embedded within the component carrier. Depending on the space being necessary and/or being available, the optical element may be a so-called micro-lens which may be realized by forming, e.g. by means also molding procedure, a transparent resin within the stepped cavity. A lens may also be formed in between a protection element and an upper surface of the (upper) component of the stepped component assembly.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless otherwise noted, in addition to any combination of features belonging to one type of subject matter also any combination between features relating to different subject matters, in particular between features of the method type claims and features of the apparatus type claims is considered as to be disclosed with this document.

DETAILED DESCRIPTION OF ILLUSTRATED EMBODIMENTS

The aspects defined above and further aspects of embodiments of the invention are apparent from the examples of embodiment to be described hereinafter and are explained with reference to the examples of embodiment. The invention will be described in more detail hereinafter with reference to examples of embodiment but to which the invention is not limited.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions elements or features, which have already been elucidated with respect to a previously described embodiment, are not elucidated again at a later position of the description.

Further, spatially relative terms, such as "front" and "back", "above" and "below", "left" and "right", et cetera are used to describe an element's relationship to another element(s) as illustrated in the Figures. Thus, the spatially relative terms may apply to orientations in use which differ from the orientation depicted in the Figures. Obviously, all such spatially relative terms refer to the orientation shown in the Figures only for ease of description and are not necessarily limiting as an apparatus according to an embodiment of the invention can assume orientations different than those illustrated in the Figures when in use.

FIGS. 1A to 1H illustrate the manufacture of a component carrier 100 with a stepped component assembly 160 being embedded within a stepped cavity 150 of a layer stack of the component carrier 100.

Figure 1A:
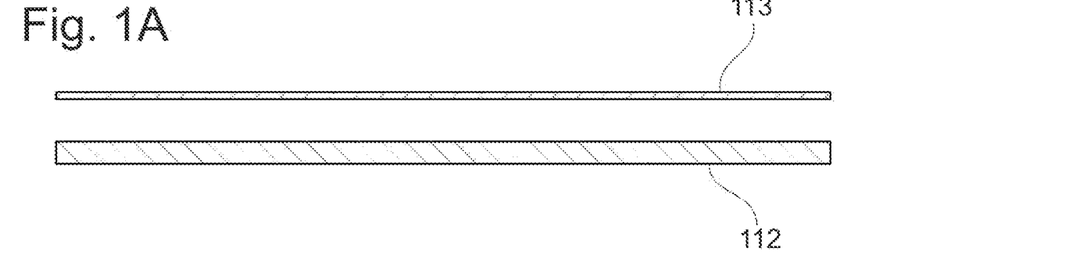
FIGS. 1A, 1B, 1C, 1D, 1E, 1F, 1G to 1H illustrate a manufacturing of a component carrier with an embedded stepped component assembly, wherein a temporary carrier is employed.
Figure 1B:
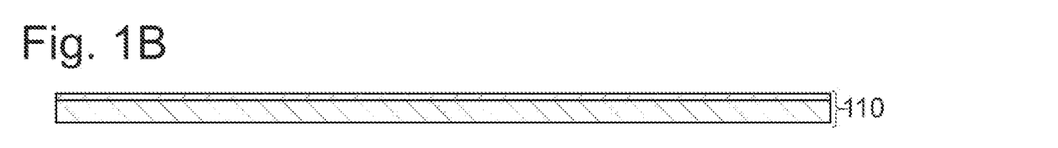

As can be seen from FIGS. 1A and 1B, the manufacturing process starts with preparing a layer composite or layer stack 110, wherein a copper foil 113 representing an electrically conductive layer is laminated on a prepreg layer 112 representing an (uncured) electrically insulating layer. Thereby, it is ensured that the temperature during this lamination process is kept below the polymerization temperature of (epoxy) resin being comprised in the prepreg layer 112. In this case the (uncured) resin escapes partially from the prepreg layer 112 and connects to the (lower) treatment surface of the electrically conductive layer 113. Thereby, the electrically insulating layer remains at least partially uncured.

Figure 1C:
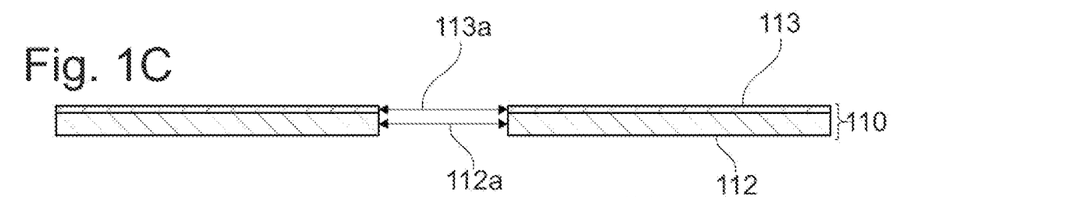

In a next step illustrated with FIG. 1C, a through opening is formed within the layer stack 110. Thereby, the opening within the electrically conductive layer 113 is denominated with reference numeral 113a and the opening within the electrically insulating layer 112 is denominated with reference numeral 112a. Further, not illustrated in FIG. 1C, fiducials can be formed in particular at the lower surface of the electrically insulating layer 112.

Figure 1D:
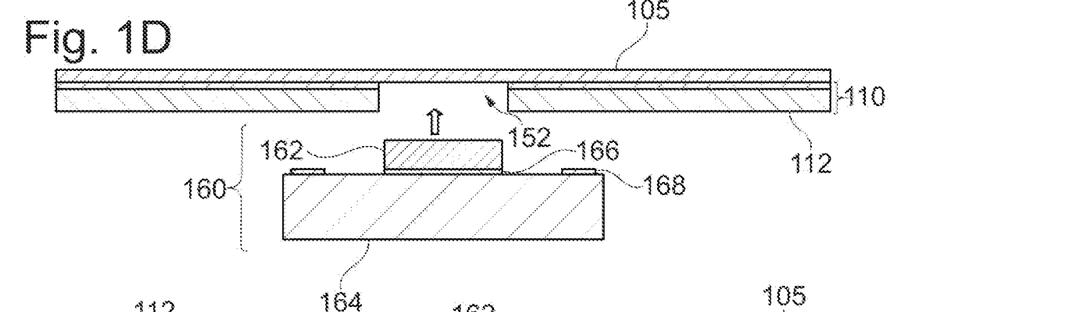

In a next step illustrated with FIG. 1D, a temporary carrier 105 is laminated on top of the layer stack 110. The temporary carrier 105 may be realized simply with an adhesive film. Further, a portion of the stepped component assembly 160 is inserted in a narrow recess 152, which corresponds to the openings 112a and 113a described above. In the embodiment described here the second component is an optical sensor component 164 having an upper sensing surface which is (mechanically) protected by the first component 162 representing a protection element. In order to improve the "optical rate of yield" a light ray guiding element being a micro-lens 166 may be optionally arranged in between the protection element 162 and the optical sensor component 164. In this context it should be clear that the protection element 162 should be transparent at least for spectral components of light which are supposed to be detected by the sensor component 164.

The protection element 162 could be a glass plate, in particular if the optical sensor component 164 is a camera sensor. The glass plate may be separated from the surface of the camera sensor by an air gap in order to allow for a correct refraction. Using a glass plate as the protection element 162 may provide the advantage that the protection element 162 will withstand a following PCB production processes like a structuring process, a solder mask process, and an assembling process. Further, the glass plate may protect a sensible sensor surface during these processes.

The component assembly 160 may be a pre-assembled structure which means that the two components are attached to each other before mounting them to the layer stack 110. Alternatively, first the first component 162 may be placed into the narrow recess 152 and second the second component 164 is mounted at the bottom surface of the first component 162.

In order to mount either the entire component assembly 160 or the two individual components 162, 164 of the component assembly 160 in a spatially precise manner the above described fiducials may be used. Mounting can be carried out with any usual (automated) mounting process.

It is mentioned that in other embodiments the stepped component assembly may comprise two electronic components, a first small or narrow upper component and a second bigger or wide lower component, which are arranged face to face with respect to each other. Thereby, non-depicted electric contacts of the two components may be electrically connected with each other by means of a contact structure which may be schematically illustrated with the reference numeral 166 (corresponding to the micro-lens of the embodiment actually shown in the drawing). Such a contact structure may be realized for instance by means of an interposer which ensures that the contacts of the first component are connected with the contacts of the second component in a proper electric manner.

Turning back to the embodiment illustrated in the drawing. As can be further seen from FIG. 1D, according to the embodiment described here an upper surface portion of the second electronic component 164, which upper surface portion is not covered by the first electronic component 162, is provided with a contact pad 168. In further processing steps this contact pad 168 can be used to directly contact the second sensor component 164 with external circuitry being arranged above the layer stack 110.

Figure 1E:
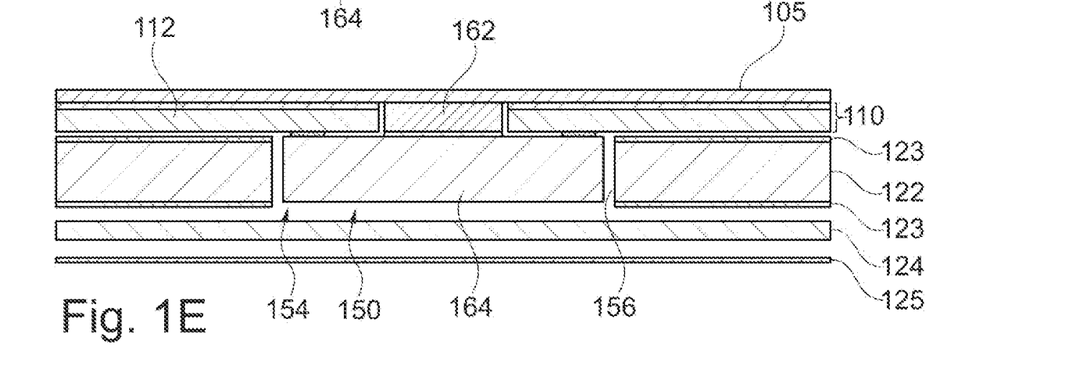

In a next step illustrated with FIG. 1E, further layer structures are arranged at the bottom side of the prepreg layer 112 respectively at the lower surface of the second component 164.

(A) Specifically, first a pre-assembled sandwich structure comprising two electrically conductive layers 123 and one electrically insulating layer 122 in between is arranged at the prepreg layer 112. This pre-assembled sandwich structure comprises an opening which spatially corresponds to the size and the shape of the second component 164. According to the embodiment described here the thickness of this pre-assembled sandwich structure is substantially the same as the thickness of the second component 164. The opening within the pre-assembled sandwich structure (later) corresponds to a wide recess 154 of the stepped cavity 150.

As can be seen from FIG. 1E, the opening within the pre-assembled sandwich structure 122, 123 is slightly larger respectively wider than the second component 164. This means that in between an outer sidewall of the second component 164 and an inner sidewall of the recess 154 there is formed a gap 156.

(B) Second, a further electrically insulating layer 124 together with a further electrically conductive layer 125 is arranged at the bottom side of the pre-assembled sandwich structure having the opening for the second component 164. According to the embodiment described here, due to the basically same thicknesses of (i) the second component 164 and (ii) the pre-assembled sandwich structure both the further electrically insulating layer 124 and the further electrically conductive layer 125 do not have such an opening.

Figure 1F:
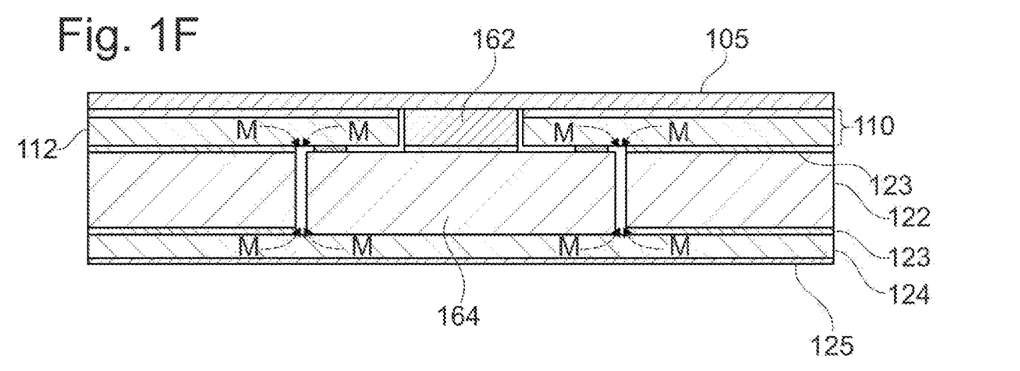

In a next step illustrated with FIG. 1F, the entire structure shown in FIG. 1E is laminated. Thereby, due to lamination heat and/or lamination pressure at least partially uncured electrically insulating material/resin originating from the prepreg layers 112 and 124 liquifies and enters the gaps 156. The corresponding material flows are denominated with reference numeral M. Optionally, at least partially uncured resin may enter further gaps formed between the outer sidewalls of the first component 162 and the inner sidewalls of the narrow recess 152.

Figure 1G:
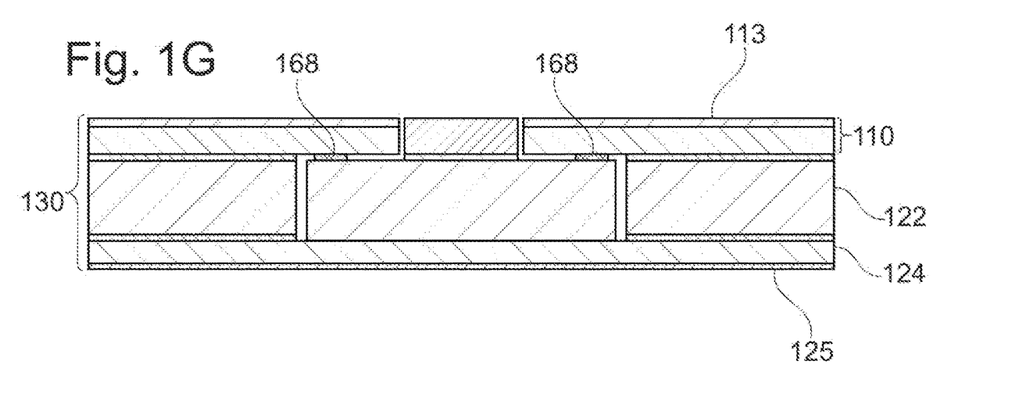

In a next step illustrated with FIG. 1G the temporary carrier 105 is removed. The remaining layer stack having the stepped component assembly 160 embedded is denominated with reference numeral 130.

It is pointed out that apart from protecting in particular the first component 162 from external physical and/or chemical impacts during the process steps elucidated above the temporary carrier 105 has the effect that the upper surface of the first component 162 and the upper surface of the layer stack 110 are coplanar. This means that the first component 162 will neither protrude from the layer stack 110 nor will form (the bottom surface of) a recess within the layer stack 110.

Figure 1H:
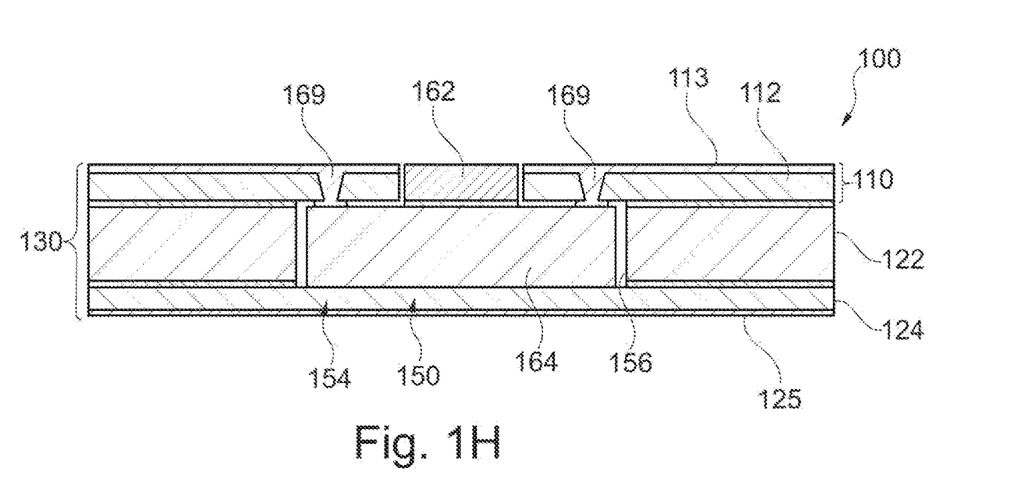

In a next (last) step illustrated with FIG. 1H (i) the upper electrically conductive layer and the lower electrically conductive layer are structured in order to form appropriate conductor paths (not shown in FIG. 1H) and (ii) contact elements 169 are formed in order to electrically contact the second component respectively the optical sensor component 164 with external circuitry. According to the embodiment described here the contact elements 169 are metallized vias extending through the layer stack 110. This means that the optical sensor component 164 is electrically contacted from the upper side. Thereby, the upper side is the light sensitive side of the component carrier 100 having the stepped component assembly 160 embedded in such a manner that the upper surface of the protection element 162 does not protrude outwardly from (the layer stack 110 of) the layer stack 130.

Optionally, after having completed all steps illustrated above the protection element 162, which it is located above the sensing surface of the optical sensor component 164, can be removed. Such a removal may be necessary if the protection element 162 blocks the light which is supposed to be detected by the sensor component 164. This removal may be realized by means of plasma etching, a wet chemical procedure, and/or a mechanical procedure. Further, laser cutting may be employed in order to cut out a material piece of the protection element 162. When applying laser cutting it may be beneficial to provide a so-called laser stop layer in between the sensing surface of the second component 164 and the lower surface of the protection element 162. With such a laser stop layer, which may be simply a copper layer, an unintended damaging of the sensing surface may be prevented. In some embodiments, which are currently considered as to the present preferred embodiments, the protection element 162 may be an adhesive film which is durable against any impact acting on the sensing surface of the sensor component 164 during all process steps. After completing the manufacturing of the described component carrier 100 this adhesive film may simply be pulled off.

FIGS. 2A to 2L, and 2M illustrate a method of manufacturing a component carrier 200*a* wherein, with the help of a release layer, a wide recess of a stepped cavity is formed, into which an upper larger component of a stepped component assembly is embedded. FIGS. 2A to 2L, 2N, and 2O illustrate a method of manufacturing a further and similar component carrier 200*b*. FIGS. 2A to 2L apply to the manufacturing of both component carriers.

Figure 2A:
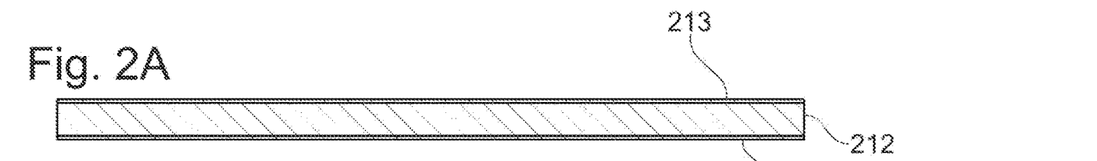
FIGS. 2A, 2B, 2C, 2D, 2E, 2F, 2G, 2H, 2I, 2J, 2K, 2L, 2M, 2N, to 2O illustrate a manufacturing of two component carriers wherein, with the help of a release layer, a wide recess of a stepped cavity is formed, into which a stepped component assembly is embedded.

As can be seen from FIG. 2A, first there is provided a sandwich structure comprising an uncured electrically insulating layer or prepreg layer 212 which is sandwiched between two electrically conductive layers 213. Each one of the two electrically conductive layers may be realized by one metallic (copper) foil 213.

Figure 2B:
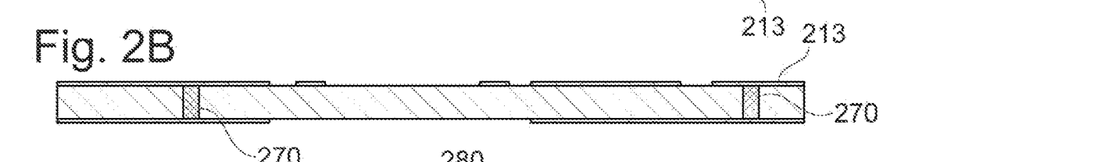

In a next step illustrated with FIG. 2B, both electrically conductive layers 213 are structured. Further, appropriate contact structures 270 extending through the prepreg layer 212 are formed. The structuring is carried out in such a manner that in a central region of both electrically conductive layers 213 the electrically conductive (copper) material is removed completely such that a comparatively large opening is formed within each layer 213. As will be seen from the Figures described below in detail, the shape and the size of the openings of the two layers 213 correspond to a narrow recess of a stepped cavity. The formation of the contact structures 270 may be realized in a known manner by means of metallized vias. Since a formation of such vias 270 is well known to the skilled person no further details are presented in this document.

Figure 2C:
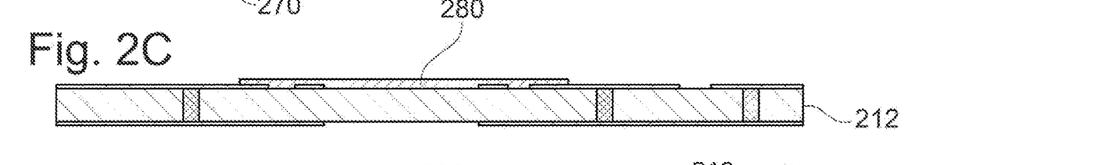

In a next step illustrated with FIG. 2C, a non-adhesive material 280 is formed as a layer over the upper structured electrically conductive layer 213 such that the opening within this layer 213 is fully covered. Further, along a horizontal direction the non-adhesive material 280, which represents a so-called release layer 280, has a significantly wider extension than this opening.

Figure 2D:
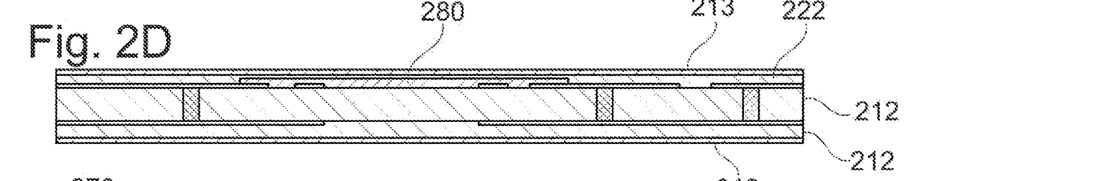

In a next step illustrated with FIG. 2D, a further layered structure comprising an electrically insulating or prepreg layer 222 as well as a further electrically conductive layer 213 are laminated on top of the release layer 280 (and the structured electrically conductive layer 213). Further, a (new) layered structure comprising an electrically insulating or prepreg layer 212 as well as a further electrically conductive layer 213 are laminated at the bottom of the layer structure of FIG. 2C.

Figure 2E:
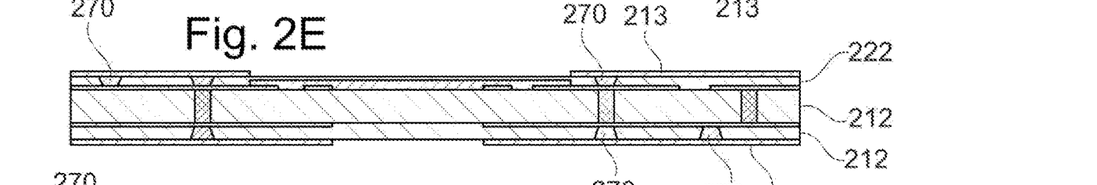

In a next step illustrated with FIG. 2E, the now topmost electrically conductive layer 213 and the lowermost electrically conductive layer 213 are structured. Thereby, the topmost electrically conductive layer 213 is provided with an opening (i) having the same shape and almost the same size as the release layer 280 and (ii) corresponding to a wide recess of the stepped cavity mentioned above. The lowermost electrically conductive layer 213 is provided with an opening having a geometry which corresponds to a narrow recess of this stepped cavity.

Further, as can also be seen from FIG. 2E, some further electric via connections 270 are formed. According to the embodiment described here two "new" electric via connections 270 (depicted in FIG. 2E top left and bottom right) are formed and two via connections 270 extend already previously formed via connections penetrating the electrically insulating layer 212, which layer 212 is located directly below the release layer 280.

Figure 2F:
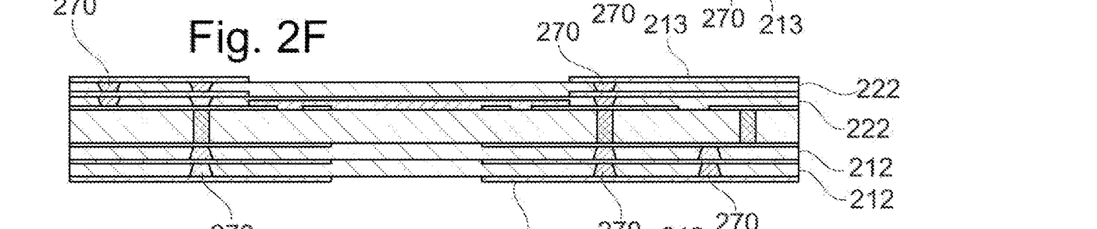

Next, as illustrated with FIG. 2F, the previous steps illustrated with FIGS. 2D and 2E are carried out again in an analogous manner. This means that (i) at the top a further upper electrically insulating layer 222 and a further upper electrically conductive layer 213 with an opening corresponding to the wide recess is formed and (ii) at the bottom a further lower electrically insulating layer 212 and a further lower electrically conductive layer 213 with an opening corresponding to the narrow recess is formed. Further, a new via connection is formed (depicted in FIG. 2F top right) and other already existing via connections are extended such that further extended stacked via connections 270 are produced.

Figure 2G:
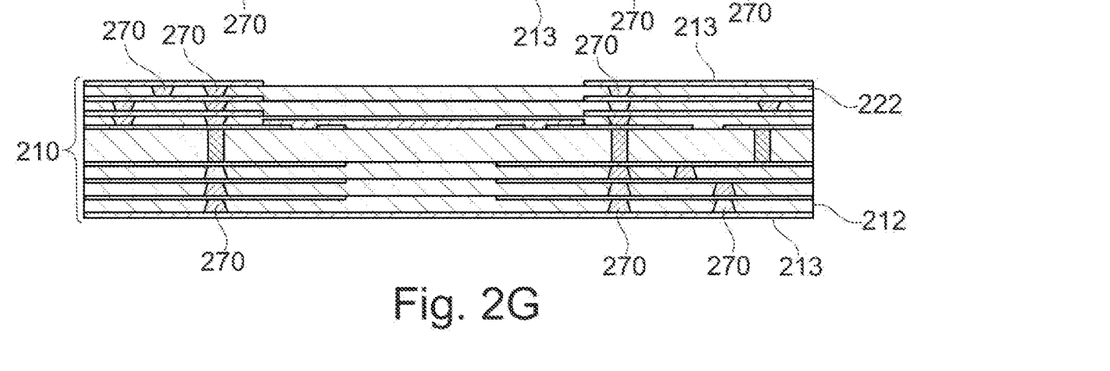

FIG. 2G illustrates the result of two following steps, wherein again (i) at the top an additional upper electrically insulating layer 222 and an appropriately structured additional upper electrically conductive layer 213 is formed and (ii) at the bottom an additional lower electrically insulating layer 212 and an appropriately structured additional lower electrically conductive layer 213 is formed. Further, additional via connections are formed which extend already existing stacked via connections 270. Now, a layer stack has been formed, which is denominated with reference numeral 210. This layer stack 210, which can be seen as to represent a core which has been produced by subsequent steps of laminating, structuring, and via forming, is the starting point for the formation of a stepped cavity.

Figures 2H, 2I:
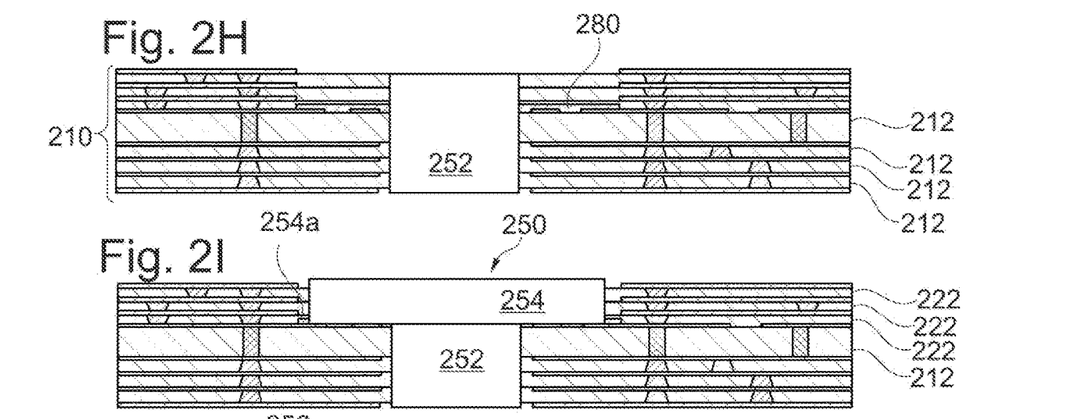

Next, as illustrated with FIG. 2H, a narrow and deep recess 252 extending completely through the layer stack 210 is formed. The formation of the recess 252, which can be seen as to represent a through hole, can be carried out by means of (mechanical) milling or laser cutting.

Next, as illustrated with FIG. 2I, a wide and shallow recess 254 is formed above the release layer 280. Thereby, a material piece is taken out from the upper electrically insulating layers 222 (as well as from the upper electrically conductive layers 213). According to the embodiment described here the described material piece is cut out by means of a laser cutting procedure. In a non-depicted top view the corresponding laser beam defines a closed laser cutting line encompassing the material piece. The laser cut extends from the top of the layer stack 210 down to the release layer 280. Thereby, the structured electrically conductive (copper) layer 213 formed directly below the release layer 280 acts as a laser stop layer. After cutting out this material piece in the described manner the material piece is taken out from the layer stack 210. Further, the remainders of the release layer 280 are removed, e.g. by means of a known stripping procedure.

For process reliability reasons the release layer 280 is, along a horizontal direction, slightly larger or wider than the wide recess 254. This has the effect that when completely removing the release layer 280 there is formed a (small) undercut 254a.

Figure 2J:
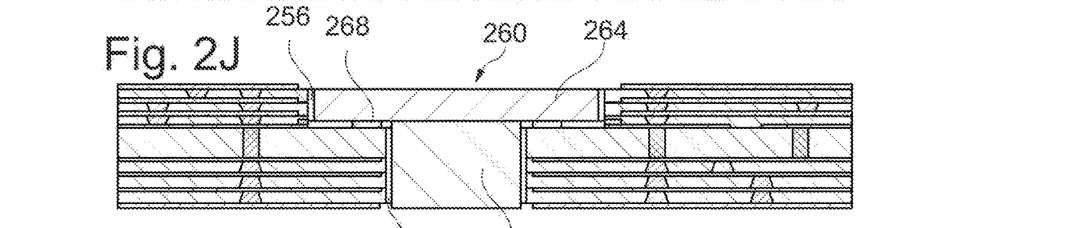

Next, as illustrated with FIG. 2J, a stepped component assembly 260 comprising a (bottom) first (small) component 262 and an (upper) second (large) component 264 is inserted into a stepped cavity 250 (mentioned already above) being defined by the narrow recess 252 and the wide recess 254. At the bottom surface of the second component 264 in a surface portion being not covered by the first component 262, there are formed contact pads 268 which can be used for electrically connecting the component 264 (from its bottom side) with external circuitry. These contact pads 268 are electrically connected to corresponding connection portions of the structured electrically conductive layer 213, which is the most upper electrically conductive layer of the layer stack being assigned to the narrow recess 252. The electric connection between the contact pads 268 and these connection portions can be realized in particular by means of a thermal compression bonding which may be carried out in the absence of any lamination step. Alternatively, this electric connection can also be realized by means of soldering and/or gluing with an electrically conductive glue.

As can be seen from FIG. 2J, the lateral or horizontal extension of the stepped cavity 250 is slightly larger than the lateral extension of the stepped component assembly 260. Therefore, after inserting the stepped component assembly 260 there are formed gaps 256 in between the outer side or lateral surfaces of the stepped component assembly 260 and the corresponding inner sidewalls of the stepped cavity 250.

Figure 2K:
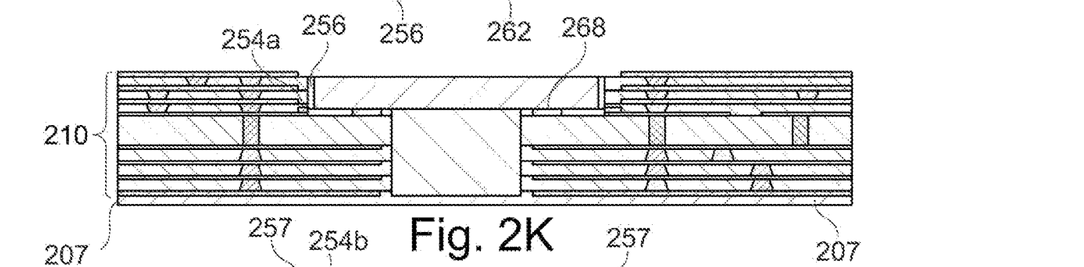

Next, as illustrated with FIG. 2K, an adhesive layer or film 207 is attached at the most bottom surface of the layer stack 210.

Figure 2L:
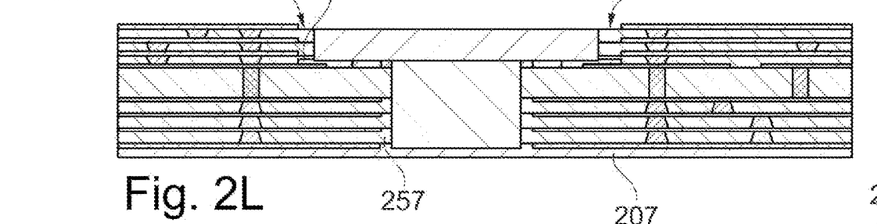

Next, as illustrated with FIG. 2L, the gaps 256 are at least partially filled with a filling or underfilling material 257 which in the described embodiment is inserted from above. It is mentioned that such an (under)filling material 257 may also be taken from presently at least partially uncured prepreg layers and/or may be inserted from the bottom before the adhesive film 207 has been attached. From FIG. 2L it can be further seen that according to the embodiment described here the (under)filling material 257 did not enter the undercuts 254a such that there remain unfilled voids 254b.

Figure 2M:
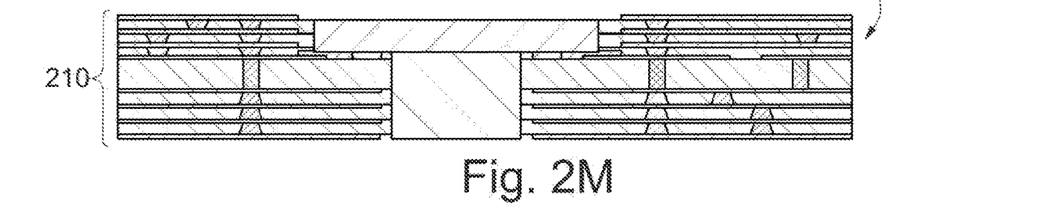

FIG. 2M illustrates the last process step for manufacturing the component carrier 200a. In this last process step the adhesive film 207 is removed.

In preferred embodiments the first component is an optical sensor component 262 having its sensing surface at the bottom. Therefore, when removing the adhesive film 207 the sensing surface of the optical sensor component 262 is exposed and "ready to sense".

Figure 2N:
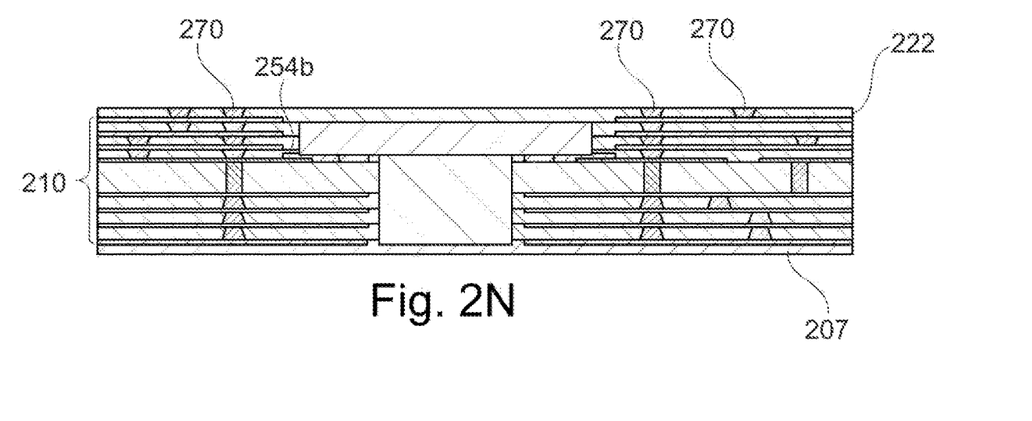
Figure 2O:
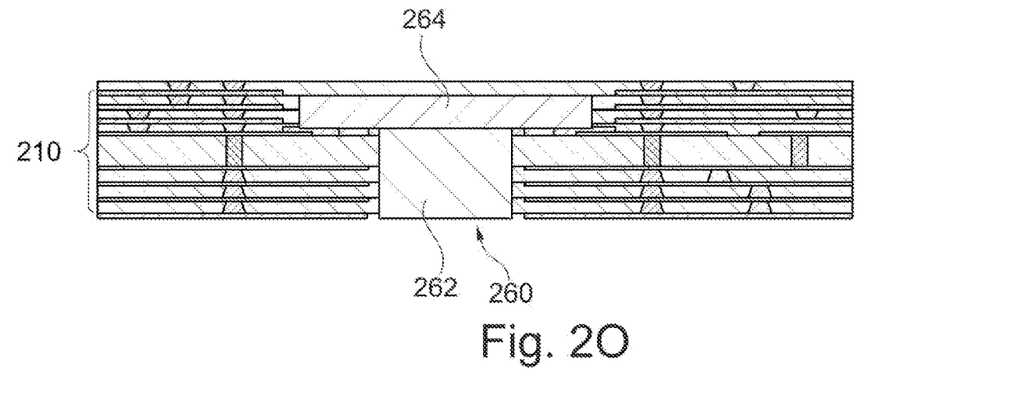

FIG. 2N and FIG. 2O illustrate the last process steps for manufacturing the component carrier 200b. As can be taken from FIG. 2N, after filling the gaps 256 with (under)filling material 257 (see FIG. 2L) a further layered structure comprising an electrically insulating or prepreg layer 222 as well as a further electrically conductive layer 213 are laminated on top of the layer stack 210. Further, a new via connection 270 is formed (depicted in FIG. 2N top right) and other via connections are extended such that further extended stacked via connections 270 are formed. FIG. 2O illustrates the last process step for manufacturing the component carrier 200b. In this last process step the adhesive film 207 is removed.

It is mentioned that filling the gaps 256 with (under)filling material 257 can also be accomplished by means of a vacuum lamination. In this case an upper laminate layer is formed under vacuum above the second component 264. Also, this upper laminate layer may comprise an electrically insulating prepreg layer and an electrically conductive (copper) layer above this prepreg layer.

It is further mentioned that embodiments of the invention may comprise a simultaneous embedding of at least two stepped component assemblies within at least two corresponding stepped cavities. Thereby, a multi-sensor device can be realized by an easy processing of well-known PCB materials and structures.

Furthermore, it is mentioned that the described embedding of a stepped component assembly within a stepped cavity allows to mount the stepped component assembly according to the principle of "chip-last". This may allow to fully test the functionality of the stepped component assembly before embedding it with the procedures and steps described in this document.

Figure 3:
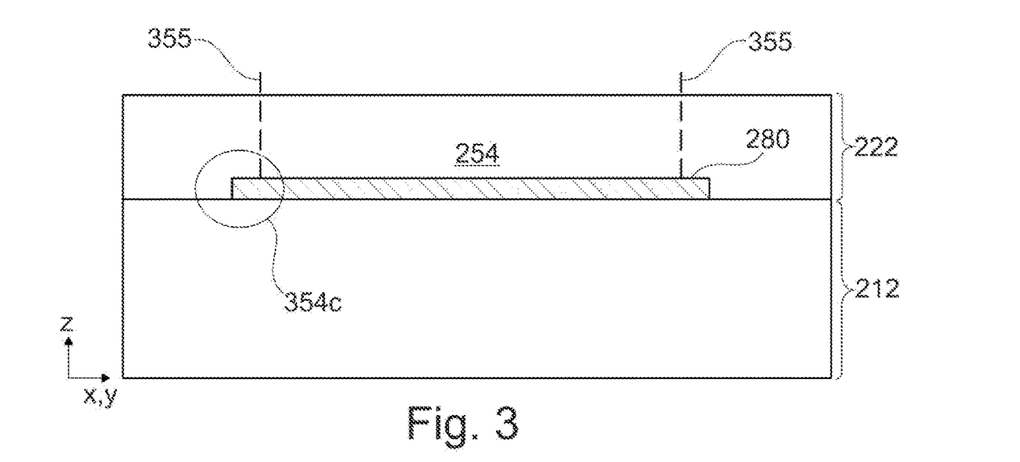
FIG. 3 illustrates the formation of an undercut when removing a release layer which has been used for forming a wide recess of a stepped cavity.

FIG. 3 illustrates the formation of an undercut when (completely) removing the release layer 280 which has been used for forming the wide recess 254 of the stepped cavity 250.

As has been already mentioned above, along a lateral or horizontal x- or y-direction the release layer 280 has a larger extension than a material piece which is cut out from at least one electrically insulating layer 222. The lateral extension of the material piece is defined by the position of a (closed) cutting line 355 which could best be seen in a top view along a vertical z-direction. When taking out this material piece the wide recess 254 is formed. It should be clear from FIG. 3 that when removing or stripping off the release layer 280 there will be formed the above mentioned undercut within an undercut region depicted in FIG. 3 with reference numeral 355.

It should be noted that the term "comprising" does not exclude other elements or steps and the use of articles "a" or "an" does not exclude a plurality. Also, elements described in association with different embodiments may be combined.

LIST OF REFERENCE SIGNS 100 component carrier
105 temporary carrier
110 layer stack
112 electrically insulating layer (uncured)/prepreg layer
112a opening
113 electrically conductive layer/metallic foil/copper foil
113a opening
122 electrically insulating layer/prepreg layer with opening
123 electrically conductive layer/metallic foil/copper foil
124 further electrically insulating layer
125 further electrically conductive layer/metallic foil/copper foil
130 layer stack
150 stepped cavity
152 narrow recess
154 wide recess
156 gap
160 stepped component assembly
162 first component/protection element
164 second component/optical sensor component 166 light ray guiding element/micro-lens
168 contact pad
169 contact element/metallized via
M material flow
200a component carrier
200b component carrier
207 adhesive layer/adhesive film
210 layer stack
212 electrically insulating layer (uncured)/prepreg layer
213 electrically conductive layer/metallic foil/copper foil
222 electrically insulating layer/prepreg layer
250 stepped cavity
252 narrow recess
254 wide recess
254a undercut
254b void
256 gap
257 (under)filling material
260 stepped component assembly
262 first component/optical sensor component
264 second component
268 contact pad
270 contact structure/contact element/(stacked) metallized via(s)
280 non-adhesive material/release layer
354c region of undercut
355 cutting line

The invention claimed is:

1. A component carrier, comprising:
a layer stack comprising at least one electrically insulating layer structure, at least one electrically conductive layer structure and a stepped cavity within the layer stack, the stepped cavity having a wide recess and a narrow recess; and
a stepped component assembly arranged within the stepped cavity;
wherein the stepped component assembly is substantially completely circumferentially surrounded by a fully cured electrically insulating material of the at least one electrically insulating layer structure;
wherein the stepped component assembly comprises a stack of at least two components having a different size and/or a different functionality;
wherein the component carrier comprises at least one of the following features:
(a) at least one of the first and second components is a sensor component;
(b) an upper surface of stepped component assembly is coplanar with an upper surface of the layer stack;
(c) one of the first and second components is or comprises a protection element; and
(d) one of the first and second components is or comprises an optical lens.

2. The component carrier according to claim 1,
wherein the layer stack comprises at least two electrically insulating layer structures,
wherein the fully cured electrically insulating material originates from at least one electrically insulating layer structure of the at least two electrically insulating layer structures.

3. The component carrier as set forth in claim 2,
wherein the stepped component assembly is substantially completely circumferentially surrounded by a further fully cured electrically insulating material originating from at least one other electrically insulating layer structure of the at least two electrically insulating layer structures.

4. The component carrier according to claim 1,
wherein the stepped cavity comprises an undercut in a transition region between the narrow recess and the wide recess.

5. The component carrier as set forth in claim 1,
wherein the narrow recess is a through opening extending through the entire layer stack and wherein the component carrier further comprises an adhesive film being formed at a lower surface of the layer stack and closing the through opening.

6. The component carrier as set forth in claim 1,
wherein the stepped component assembly comprises a first component and a second component, the first component having a larger main surface area than the second component;
wherein at least one contact element extends from the first component to a surface of the component carrier and penetrating a layer structure of the layer stack within which the narrow recess is formed.

7. The component carrier as set forth in claim 1,
wherein the fully cured electrically insulating material is laminated.

8. A component carrier, comprising:
a layer stack comprising at least one electrically insulating layer structure, at least one electrically conductive layer structure and a stepped cavity within the layer stack, the stepped cavity having a wide recess and a narrow recess; and
a stepped component assembly arranged within the stepped cavity;
wherein the stepped component assembly is substantially completely circumferentially surrounded by a fully cured electrically insulating material of the at least one electrically insulating layer structure;
wherein the stepped cavity comprises an undercut in a transition region between the narrow recess and the wide recess.

9. A component carrier, comprising:
a layer stack comprising at least one electrically insulating layer structure, at least one electrically conductive layer structure and a stepped cavity within the layer stack, the stepped cavity having a wide recess and a narrow recess; and
a stepped component assembly arranged within the stepped cavity;
wherein the stepped component assembly is substantially completely circumferentially surrounded by a fully cured electrically insulating material of the at least one electrically insulating layer structure;
wherein the narrow recess is a through opening extending through the entire layer stack and wherein the component carrier further comprises an adhesive film being formed at a lower surface of the layer stack and closing the through opening.

* * * * *